(12) United States Patent
Bhatti et al.

(10) Patent No.: US 7,424,906 B2
(45) Date of Patent: Sep. 16, 2008

(54) HIGH PERFORMANCE THERMOSIPHON WITH INTERNALLY ENHANCED CONDENSATION

(75) Inventors: Mohinder Singh Bhatti, Amherst, NY (US); Ilya Reyzin, Williamsville, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 192 days.

(21) Appl. No.: 11/406,621

(22) Filed: Apr. 19, 2006

(65) Prior Publication Data

US 2007/0246196 A1 Oct. 25, 2007

(51) Int. Cl.
*F28D 15/02* (2006.01)
(52) U.S. Cl. ............ 165/80.3; 165/104.21; 165/104.33; 361/700
(58) Field of Classification Search ................ 165/80.3, 165/104.21, 104.33; 361/700
See application file for complete search history.

(56) References Cited

U.S. PATENT DOCUMENTS

| 6,019,165 | A | * | 2/2000 | Batchelder | 165/80.3 |
| 6,021,844 | A | * | 2/2000 | Batchelder | 165/80.3 |
| 6,408,937 | B1 | * | 6/2002 | Roy | 165/104.33 |
| 6,918,431 | B2 | | 7/2005 | Reyzin et al. | 165/104.21 |
| 2002/0185263 | A1 | * | 12/2002 | Wagner et al. | 165/104.33 |
| 2004/0052049 | A1 | * | 3/2004 | Wu et al. | 361/699 |

* cited by examiner

*Primary Examiner*—Teresa J Walberg
(74) *Attorney, Agent, or Firm*—Patrick M. Griffin

(57) ABSTRACT

A thermosiphon cooling assembly includes a refrigerant disposed in a lower portion of a housing for undergoing a liquid-to-vapor-to-condensate cycle. A mixing device is disposed within the lower portion of the housing for increasing the transfer of heat from the electronic device during the liquid-to-vapor-to-condensate cycle. The mixing device may include a vapor stirrer disposed above the liquid of the refrigerant and/or a liquid stirrer disposed in the liquid of the refrigerant for moving the liquid of the refrigerant over a boiler plate.

16 Claims, 2 Drawing Sheets

HIGH PERFORMANCE THERMOSIPHON WITH INTERNALLY ENHANCED CONDENSATION

CROSS REFERENCE TO RELATED APPLICATION

Co-pending application Ser. No. 11/406,617, filed Apr. 19, 2006 (DP-314469, DW 604080-00010) discloses and claims the patentably distinct concept of the configuration of disposing condensing tubes circumferentially about an axis. Although, the instant application discloses and claims the patentably distinct concept of mixing in the refrigerant cycle, the instant application illustrates this patentably distinct concept in a configuration which disposes the condensing tubes circumferentially about an axis.

BACKGROUND OF THE INVENTION

1. Field of the Invention

The subject invention relates to a thermosiphon cooling assembly for cooling an electronic device.

2. Description of the Prior Art

The operating speed of computers is constantly being improved to create faster computers. With this, comes increased heat generation and a need to effectively dissipate that heat.

Heat exchangers and heat sink assemblies have been used that apply natural or forced convection cooling methods to dissipate heat from electronic devices that are highly concentrated heat sources such as microprocessors and computer chips. These heat exchangers typically use air to directly remove heat from the electronic devices; however air has a relatively low heat capacity. Thus, liquid-cooled units called LCUs employing a cold plate in conjunction with high heat capacity fluids have been used to remove heat from these types of heat sources. Although LCUs are satisfactory for moderate heat flux, increasing computing speeds have required more effective heat sink assemblies.

Accordingly, thermosiphon cooling units (TCUs) have been used for cooling electronic devices having a high heat flux. A typical TCU absorbs heat generated by the electronic device by vaporizing the working fluid housed on the boiler plate of the unit. The boiling of the working fluid constitutes a phase change from liquid-to-vapor state and as such the working fluid of the TCU is considered to be a two-phase fluid. The vapor generated during boiling of the working fluid is then transferred to a condenser, where it is liquefied by the process of film condensation over the condensing surface of the TCU. The heat is rejected into a stream of air flowing through a tube running through the condenser or flowing over fins extending from the condenser. Alternatively, a second refrigerant can flow through the tube increasing the cooling efficiency. The condensed liquid is returned back to the boiler plate by gravity to continue the boiling-condensing cycle.

An example of a cooling system for electronic devices is disclosed in U.S. Pat. No. 6,918,431 to Reyzin et al.

The Reyzin patent discloses a housing having an upper portion and a lower portion wherein the upper portion is a single condensing chamber extending upwardly and outwardly from the lower portion in a conical shape. A refrigerant is disposed within the lower portion of the housing for liquid-to-vapor transformation. An air moving device is disposed over the exterior of the housing to circulate a flow of air over a plurality of fins.

Although the prior art dissipates heat from electronic devices, as computing speeds increase, there is a continuing need for cooling devices having more efficient or alternative heat transfer capabilities as compared to the conventional electronic cooling assemblies.

SUMMARY OF THE INVENTION AND ADVANTAGES

The invention provides a thermosiphon cooling assembly for cooling an electronic device. The assembly includes a housing having a lower portion and an upper portion, with a refrigerant disposed in the lower portion of the housing for undergoing a liquid-to-vapor-to-condensate cycle within the housing. The assembly is distinguished by having a mixing device disposed within the housing for increasing the transfer of heat from the electronic device during the cycle.

The subject invention also provides a method of cooling an electronic device wherein heat is generated by the electronic device and is transferred from the electronic device to the lower portion of the housing. The method includes cycling a refrigerant disposed in the lower portion of the housing through a liquid-to-vapor-to-condensate cycle within the housing. The method is distinguished by mixing the refrigerant within the housing and thus increasing the transfer of heat from the electronic device during the cycle.

Accordingly, the invention enhances or increases the efficiency of the assembly. When a mixing device includes a stirrer disposed above the liquid of the refrigerant, the vapor in the area above the liquid is mixed and thus the condensing efficiency of the assembly is enhanced. When the mixing device includes a stirrer disposed in the liquid of the refrigerant, the liquid of the refrigerant is mixed and thus the boiling efficiency of the assembly is enhanced. When the mixing device includes a stirrer that is partially submerged in the liquid or a plurality of stirrers, one stirrer in the liquid of the refrigerant and one stirrer above the liquid of the refrigerant, both the condensing and boiling efficiencies of the assembly are enhanced.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
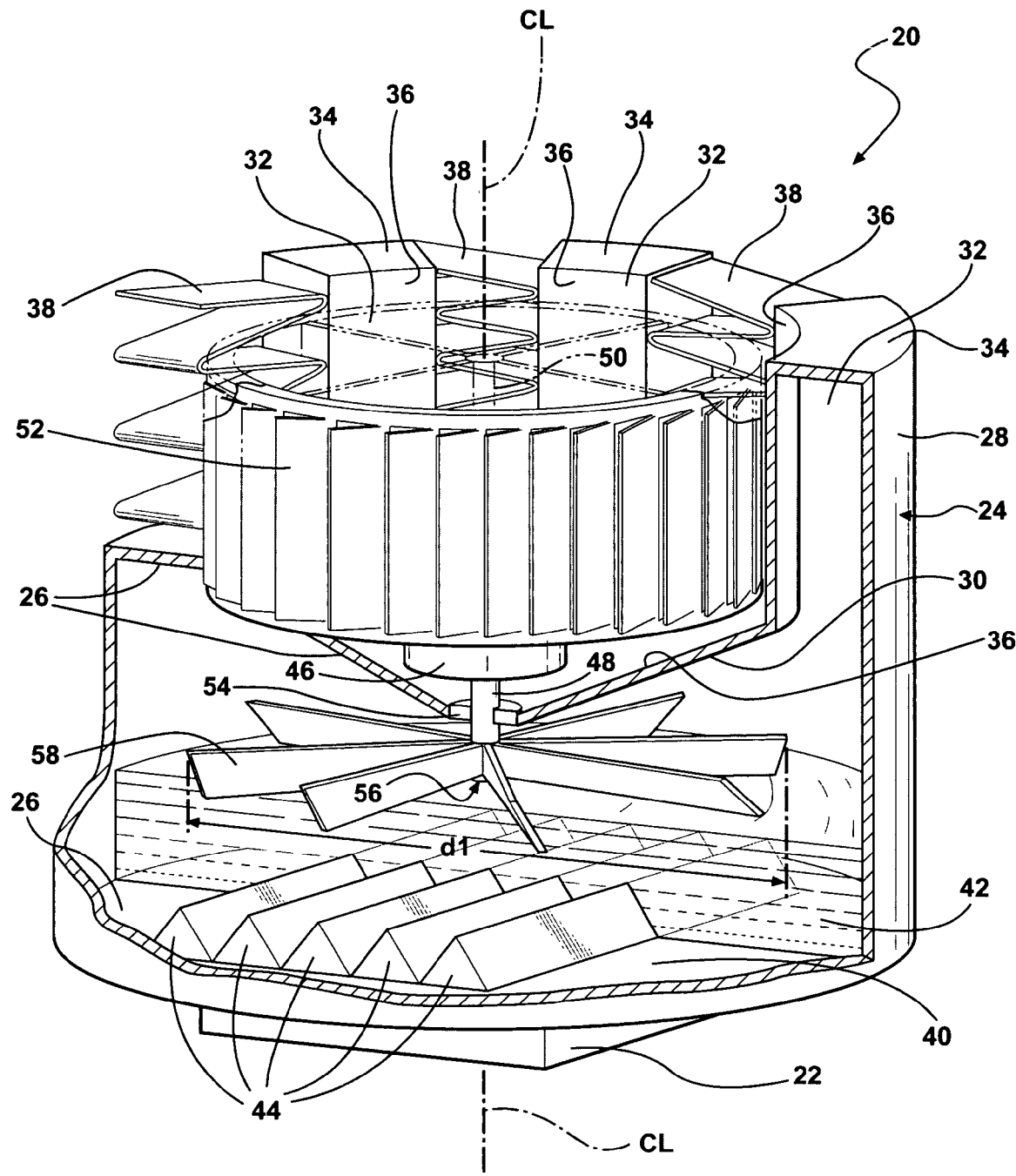
FIG. 1 is a perspective view partially broken away and in cross section of the subject invention.
Figure 2:
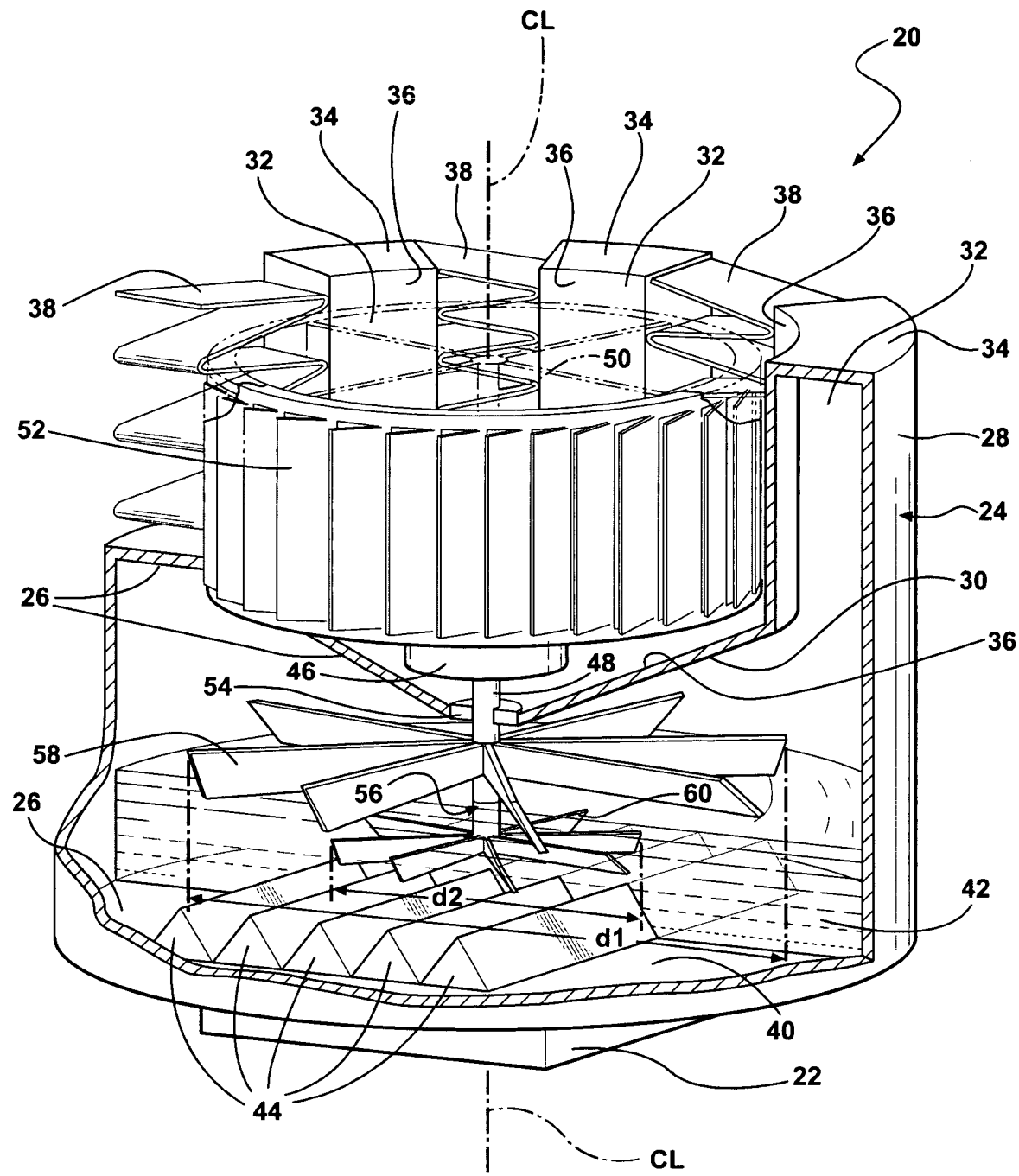
FIG. 2 is a perspective view partially broken away and in cross section of an alternative embodiment.

Referring to the Figures, wherein like numerals indicate corresponding parts throughout the several views, a thermosiphon cooling assembly 20 is generally shown for cooling an electronic device 22 in FIGS. 1 and 2.

The assembly 20 includes a housing 24 generally indicated having a lower portion 26 and an upper portion 28. The housing 24 defines a generally cylindrical periphery extending about a central axis CL. In addition to being generally cylindrical the housing 24 can be any shape known in the art, such as generally rectangular.

The lower portion 26 includes a conical top wall 30 extending upwardly and outwardly at an angle from the axis CL. The upper portion 28 includes a plurality of condensing tubes 32 that are spaced radially from and extend parallel to the axis CL. The condensing tubes 32 extend upwardly from and about the top wall 30 of the lower portion 26 of the housing 24 to a distal end 34. The condensing tubes 32 are spaced equally and circumferentially about the periphery of the housing 24 and define an internal cavity 36 centrally of the condensing tubes 32. The condensing tubes 32 are generally rectangular in cross section, but may be circular in cross-section.

A plurality of cooling fins 38 are disposed in the spaces between adjacent condensing tubes 32 about the axis CL. The cooling fins 38 extend circumferentially between adjacent ones of the condensing tubes 32 for dissipating heat from the condensing tubes 32 to ambient air.

The housing 24 further includes a circular boiler plate 40 spaced from the top wall 30. The shape of the boiler plate 40 is consistent with the shape of the housing 24. The boiler plate 40 transfers heat from the electronic device 22 into the lower portion 26 of the housing 24. A grease layer is disposed over the boiler plate 40 for establishing a predetermined thermal interface between the boiler plate 40 and the electronic device 22.

A liquid refrigerant 42 is disposed in the lower portion 26 of the housing 24 over the boiler plate 40. The refrigerant 42 undergoes a liquid-to-vapor-to-condensate cycle within the housing 24 to transfer heat from the electronic device 22. A plurality of heat transfer fins 44 are disposed on the boiler plate 40 in the lower portion 26 of the housing 24 for transferring heat from the electronic device 22 disposed on the exterior of the boiler plate 40 to the refrigerant 42.

A motor 46 is supported along the axis CL adjacent to the top wall 30 and within the internal cavity 36. Alternatively, the motor 46 may be supported within the housing 24. The motor 46 can be supported by the top wall 30 of the lower portion 26 by a bracket or any other support means. The motor 46 includes a first shaft 48 that extends downwardly from the motor 46 and a second shaft 50 that extends upwardly from the motor 46. Both the first shaft 48 and second shaft 50 are rotated by the motor 46. While the subject invention shows the first shaft 48 and the second shaft 50 extending in opposite directions from the motor 46, it should be noted that the subject invention can be utilized with a single shaft extending from the motor 46 or through the motor 46.

The assembly 20 includes an air moving device 52, such as a centrifugal fan, which is disposed on the second shaft 50 in the internal cavity 36. The air moving device 52 moves ambient air radially between the condensing tubes 32 and over the cooling fins 38. In addition, the air moving device 52 may be disposed above the housing 24 or adjacent to a side of the housing 24.

The assembly 20 is distinguished by the first shaft 48 extending through the top wall 30 of the housing 24 on the axis CL with a seal 54 disposed between the first shaft 48 and the top wall 30 of the housing 24 for keeping the vapor from escaping from the housing 24. The seal 54 may be similar to the seals 54 used in automotive air conditioning system compressors.

A mixing device 56 is disposed on and rotated by the first shaft 48. The mixing device 56 is disposed within the lower portion 26 of the housing 24 for increasing the transfer of heat from the electronic device 22 during the liquid-to-vapor-to-condensate cycle.

The mixing device 56 includes a vapor stirrer 58, such as an axial fan or propeller, having a first diameter ($d_1$). The vapor stirrer 58 is disposed above the liquid of the refrigerant 42 and moves the vapor away from the liquid of the refrigerant 42. The invention may include a plurality of such vapor stirrers 58 disposed above the liquid of the refrigerant 42.

The mixing device 56 may further include a liquid stirrer 60. The liquid stirrer 60 is vertically spaced from the vapor stirrer 58 and has a second diameter ($d_2$), which is smaller than the first diameter ($d_1$) of the vapor stirrer 58. The liquid stirrer 60 is disposed in the liquid of the liquid refrigerant 42 and moves the liquid of the refrigerant 42 over the boiler plate 40. The invention may include a plurality of such liquid stirrers 60 disposed in the liquid of the refrigerant 42.

The mixing device 56 may be totally disposed in the liquid of the refrigerant 42 or totally disposed in the vapor above the liquid of the refrigerant 42, or partially disposed in both, i.e., one or two stirrers 58, 60. In the embodiment of FIG. 2, the stirrers 58, 60 move both the liquid of the refrigerant 42 over the boiler plate 40 and the vapor above the liquid of the refrigerant 42 away from the liquid of the refrigerant 42.

The subject invention also provides for a method of cooling the electronic device 22 with the refrigerant 42 disposed in the lower portion 26 of the housing 24 for a liquid-to-vapor-to-condensate cycle. The method includes the steps of generating heat by the electronic device 22, and transferring heat from the electronic device 22 to the lower portion 26 of the housing 24. The method proceeds with the steps of cycling the refrigerant 42 in the lower portion 26 of the housing 24 through a liquid-to-vapor-to-condensate cycle within the housing 24. The method is distinguished by mixing the refrigerant 42 within the housing 24 for increasing the transfer of heat from the electronic device 22 during the cycle.

Obviously, many modifications and variations of the present invention are possible in light of the above teachings. The invention may be practiced otherwise than as specifically described within the scope of the appended claims.

What is claimed is:

1. A thermosiphon cooling assembly for cooling an electronic device comprising;
    a housing having a lower portion and an upper portion,
    a refrigerant disposed in said lower portion of said housing for undergoing a liquid-to-vapor-to-condensate cycle within said housing, and
    a mixing device disposed within said housing for increasing the transfer of heat from the electronic device during the cycle, wherein said mixing device includes a vapor stirrer disposed in the vapor of said refrigerant for moving the vapor away from the liquid of said refrigerant.

2. An assembly as set forth in claim 1 wherein said mixing device includes a liquid stirrer disposed in the liquid of said refrigerant for moving the liquid of said refrigerant.

3. An assembly as set forth in claim 1 wherein said mixing device includes a liquid stirrer vertically spaced from said vapor stirrer and disposed in the liquid of said refrigerant for moving the liquid of said refrigerant.

4. A thermosiphon cooling assembly for cooling an electronic device comprising:
    a housing having a lower portion and an upper portion,
    a refrigerant disposed in said lower portion of said housing for undergoing a liquid-to-vapor-to-condensate cycle within said housing, and
    a mixing device disposed within said housing for increasing the transfer of heat from the electronic device during the cycle;
    wherein said mixing device includes a vapor stirrer disposed above the liquid of said refrigerant for moving the vapor away from the liquid of said refrigerant, and a liquid stirrer vertically spaced from said vapor stirrer and disposed in the liquid of said refrigerant for moving the liquid of said refrigerant; wherein said vapor stirrer has a first diameter and said liquid stirrer has a second diameter, said first diameter being greater than said second diameter.

5. An assembly as set forth in claim 4 wherein said housing defines a generally cylindrical periphery extending about a central axis.

6. An assembly as set forth in claim 5 wherein said lower portion of said housing includes a top wall and said upper portion includes a plurality of condensing tubes spaced radially from and extending parallel to said axis and upwardly from said top wall of said lower portion of said housing to a distal end and spaced equally and circumferentially about said periphery of said housing to define an internal cavity centrally of said condensing tubes.

7. An assembly as set forth in claim 6 including a plurality of cooling fins disposed about said axis and extending circumferentially between adjacent ones of said condensing tubes for dissipating heat from said condensing tubes to ambient air.

8. An assembly as set forth in claim 7 wherein said mixing device includes a motor supported adjacent to said top wall and a first shaft extending from said motor for rotation thereby, said vapor stirrer and said liquid stirrer being disposed on and rotated by said first shaft.

9. An assembly as set forth in claim 8 wherein said motor is supported along said axis and within said internal cavity, said first shaft extending downwardly from said motor and through said top wall of said housing.

10. An assembly as set forth in claim 9 wherein said motor includes a second shaft extending upwardly from said motor and said motor rotates said second shaft.

11. An assembly as set forth in claim 10 including an air moving device disposed on said second shaft for moving air radially between said condensing tubes and over said cooling fins.

12. An assembly as set forth in claim 11 including a seal disposed between said first shaft and said top wall of said housing for keeping vapor from escaping from said housing.

13. An assembly as set forth in claim 12 wherein said housing has a circular boiler plate spaced from said top wall for transferring heat from the electronic device.

14. An assembly as set forth in claim 13 wherein said top wall of said lower portion is conical and extends upwardly and outwardly at an angle from said axis.

15. An assembly as set forth in claim 13 including a plurality of heat transfer fins disposed on said boiler plate in said lower portion of said housing for transferring heat from the electronic device disposed on the exterior of said boiler plate to said refrigerant.

16. A thermosiphon cooling assembly for cooling an electronic device comprising;
a housing having a lower portion and an upper portion and defining a generally cylindrical periphery extending about a central axis,
said lower portion having a conical top wall extending upwardly and outwardly at an angle from said axis,
said upper portion including a plurality of condensing tubes spaced radially from and extending parallel to said axis and upwardly from and about said top wall of said lower portion of said housing to a distal end and spaced equally and circumferentially about said periphery of said housing to define an internal cavity centrally of said condensing tubes,
a plurality of cooling fins disposed about said axis and extending circumferentially between adjacent ones of said condensing tubes for dissipating heat from said condensing tubes to ambient air,
said housing having a circular boiler plate spaced from said top wall for transferring heat from the electronic device to said lower portion,
a liquid refrigerant disposed in said lower portion of said housing over said boiler plate for undergoing a liquid-to-vapor-to-condensate cycle within said housing to transfer heat from the electronic device,
a plurality of heat transfer fins disposed on said boiler plate in said lower portion of said housing for transferring heat from the electronic device disposed on the exterior of said boiler plate to said liquid refrigerant,
a motor supported along said axis and adjacent to said top wall and within said internal cavity having a first shaft extending downwardly from said motor for rotation thereby and a second shaft extending upwardly from said motor for rotation thereby,
an air moving device including a centrifugal fan disposed on said second shaft in said internal cavity for moving ambient air radially between said condensing tubes and over said cooling fins,
said first shaft extending through said top wall of said housing on said axis,
a seal disposed between said first shaft and said top wall of said housing for keeping the vapor from escaping from said housing, and
a mixing device disposed on and rotated by said first shaft and disposed within said lower portion of said housing for increasing the transfer of heat from the electronic device during the cycle,
said mixing device including a vapor stirrer having a first diameter and disposed above the liquid of said liquid refrigerant for moving the vapor away from the liquid of said liquid refrigerant,
said mixing device including a liquid stirrer vertically spaced from said vapor stirrer and having a second diameter smaller than said first diameter of said vapor stirrer and disposed in the liquid of said liquid refrigerant for moving the liquid of said liquid refrigerant over said boiler plate.

* * * * *